(12) United States Patent
Ohtaka et al.

(10) Patent No.: US 6,509,643 B2
(45) Date of Patent: Jan. 21, 2003

(54) TAB TAPE WITH STIFFENER AND SEMICONDUCTOR DEVICE USING SAME

(75) Inventors: Tatsuya Ohtaka, Ibaraki (JP); Sachio Suzuki, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/893,753

(22) Filed: Jun. 29, 2001

(65) Prior Publication Data

US 2002/0017716 A1 Feb. 14, 2002

(30) Foreign Application Priority Data

Jun. 29, 2000 (JP) ........................................ 2000-201424

(51) Int. Cl.$^7$ .............................................. H01L 23/52
(52) U.S. Cl. ........................ 257/712; 257/779; 257/700; 257/695; 257/691; 257/738; 257/758; 257/737; 257/668
(58) Field of Search ................................ 257/700, 701, 257/712, 713, 717, 720, 692, 693, 707, 758, 784, 786

(56) References Cited

U.S. PATENT DOCUMENTS 6,020,637 A * 2/2000 Karnezos .................. 257/738
6,028,358 A * 2/2000 Suzuki ...................... 257/737
6,046,495 A * 4/2000 Urushima .................. 257/668
2001/0001505 A1 * 5/2001 Schueller et al. .......... 257/738
2001/0054768 A1 * 12/2001 Kim .......................... 257/758

FOREIGN PATENT DOCUMENTS

JP 8-213732 8/1996

* cited by examiner

Primary Examiner—Nathan J. Flynn
Assistant Examiner—Fazli Erdem
(74) Attorney, Agent, or Firm—Foley & Lardner

(57) ABSTRACT

A TAB tape with a stiffener is prepared by bonding a one-metal TAB tape 20 having a structure wherein a circuit pattern 21 is formed on either surface of a first tape base material, a part thereof is covered with an insulating film 2, and a via hole 12 is defined on a connecting regional section 25 for via, to a tape 30 for second metal prepared by providing a metallic foil layer 14 on either surface of a second tape base material 15 through an adhesive layer 15; the connecting regional section 25 for via on the upper edge of a via hole is electrically connected with a part of the metallic foil layer 14 on the bottom of the hole by means of conducting means (4, 16, and 18), and at the same time, an exposed portion 32 of the metallic foil layer 14, which has not been covered with the one-metal TAB tape 20, is connected to an electrode 71 of a ground line in the semiconductor 7 by means of a bonding wire 83 to lead a ground potential. Thus, an inexpensive TAB tape with a stiffener having equivalent electrical characteristics to that in the case where a conventional two-metal and one-base material TAB tape is used, and a TBGA semiconductor device using such TAB tape with a stiffener is obtained.

8 Claims, 5 Drawing Sheets

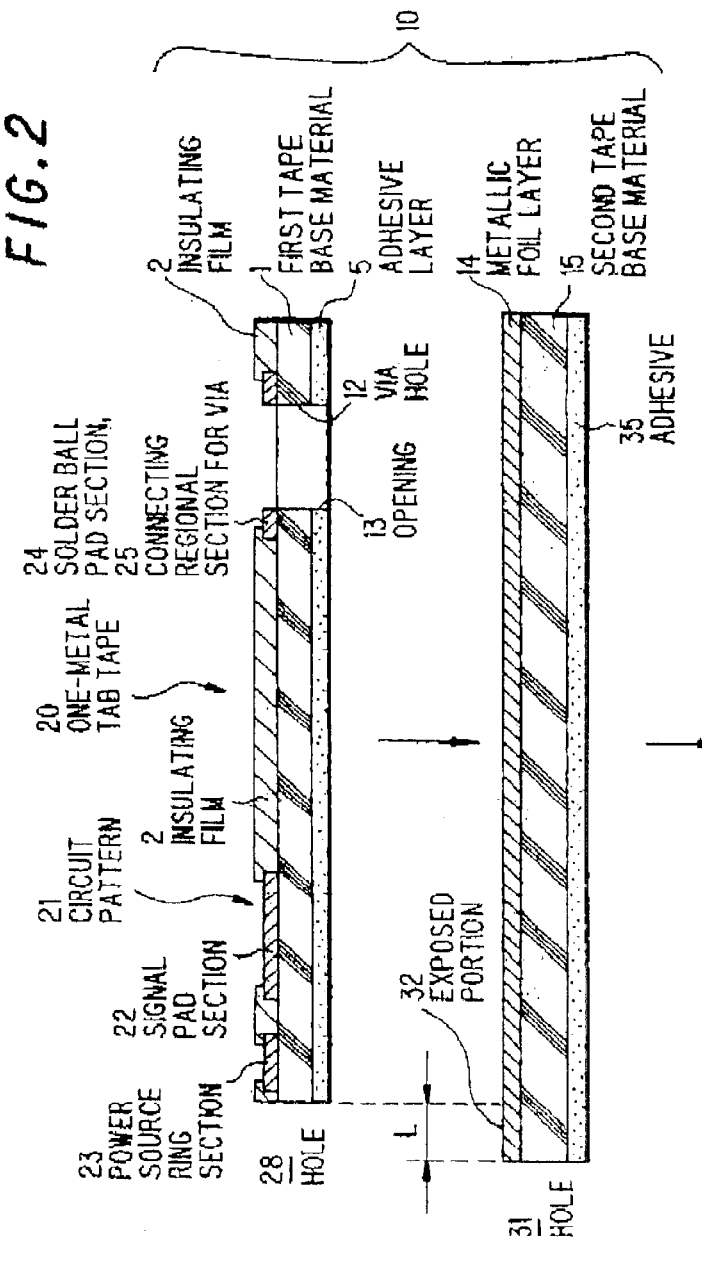
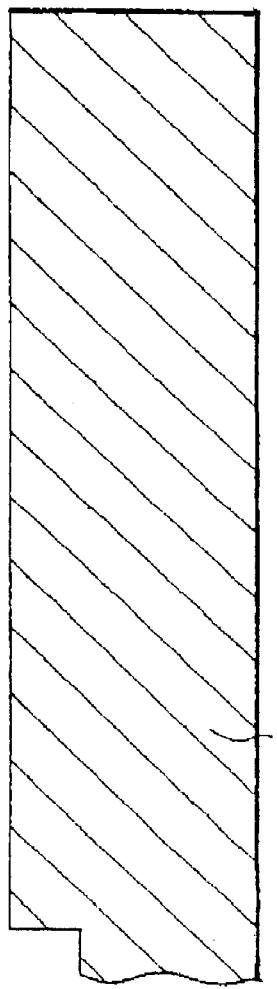
FIG.2

TAB TAPE WITH STIFFENER AND SEMICONDUCTOR DEVICE USING SAME

FIELD OF THE INVENTION

The present invention relates to a TAB (Tape Automated Bonding) tape with a stiffener, which is a combined cooling plate and stiffener being a so-called "stiffener", and a tape BGA (Ball Grid Array) semiconductor device using the same.

BACKGROUND OF THE INVENTION

A one-metal TAB tape is usual as a TAB tape, and such one-metal TAB tape is prepared by forming a wired pattern on either surface of an insulating film made of polyimide resin used for a tape base material.

In this respect, there is a tendency to direct high frequency in chips mounted on a personal computer and the like, whereby a need for a circuit having a high transmission rate increases. With increase in data transmission rate, a new problem of noise generation due to electromagnetic field coupling between leads appears on a fine-pitch wiring in a TAB tape, and it became impossible to ignore such problem. For instance, there is such a problem that a ringing (resonance) phenomenon arises between leads disposed with a spacing of 30 $\mu$m, so that a signal wave form of clock pulse deforms remarkably.

In order to overcome such problem as described above, the following constitution is considered effective. Namely, the constitution is arranged in such that a ground layer is disposed on the surface opposite to a side of a tape base material on which a wired pattern has been formed, whereby influence of noise due to mutual inductance between wirings due to use of leads in a package does not result in a problem in view of operating characteristics.

In these circumstances, a two-metal (double layered) TAB tape wherein a wired pattern has been formed on opposite surfaces of a polyimide resin insulating film used for a tape base material, respectively, is noticed as a TAB tape capable of eliminating such problem as described above.

A semiconductor device having a conventional T-BGA (Tape BGA) structure wherein the two-metal TAB tape is used is shown in FIG. 5.

First, a circuit pattern 21 with a signal circuit containing solder ball pad sections 26, a bonding pad section 27, and a routed lead section is formed on either surface of a tape base material 1 composed of a polyimide resin insulating film. Then, a part of the circuit pattern 21 is insulated with an insulating film 2 made from a photo solder resist (PSR). A ground layer 6 is disposed on the other surface of the tape base material 1. The above-described solder ball pad sections 26 and the bonding pad section 27 are electrically connected to the ground layer 6 through a conductive via section 3, whereby a two-metal TAB tape 50 is constituted. The resulting two-metal TAB tape 50 is bonded to a stiffener 40 wherein a concave portion 41 for mounting a semiconductor chip has been defined on a central portion of a metal sheet through an adhesive 5 to obtain a TAB tape with a stiffener.

Then, a semiconductor chip 7 is bonded to the concave portion 41 of the above-described stiffener 40 with the use of a device-fixing agent 9 as its adhesive. An electrode 71 of the semiconductor chip 7 is connected with the above-described circuit pattern 21 by a bonding wire 8, and further the above-described semiconductor chip 7 and the bonding wire 8 are sealed by means of a sealing resin 100, whereby the semiconductor device is constituted. Solder balls 4 are installed on the respective solder ball pad sections 26.

According to the above-described constitution, there is the ground layer 6 being an electrically conductive layer beneath the tape base material 1 being a thin insulating layer. Accordingly, eddy currents flow in the ground layer 6 along directions wherein magnetic fluxes produced by electric currents flowing through respective wirings are cancelled in the case when a high frequency signal is loaded on the wirings in the signal circuit. As a result, an apparent inductance and an apparent inductive crosstalk can be reduced, whereby reliability and speeding up in a velocity of propagation of electrical signals are achieved.

However, two-metal and one-base material TAB tape is very expensive, so that a T-BGA semiconductor device prepared by using such TAB tape becomes very expensive, consequently.

SUMMARY OF THE INVENTION

Accordingly, an object of the present invention is to provide an inexpensive TAB tape with a stiffener wherein a two-metal and two-base material TAB tape having a structure prepared by bonding an ordinary single metal TAB to a tape material of a ground layer is used for solving the above-described problems and improving electrical characteristics thereof, and as a result, equivalent reliability and equivalent speeding up in a velocity of propagation of electrical signals to those of the case where a conventional two-metal and one-base material TAB tape is employed are achieved as well as to provide a T-BGA semiconductor using such TAB tape with a stiffener as described above.

In order to achieve the above-described object, the present inventions have been constituted as described hereinafter.

(1) A TAB tape with a stiffener according to a first invention as claimed in claim 1 is characterized by that a circuit pattern containing a signal circuit is formed on either surface of a first tape base material made from an insulating film; a part of the circuit pattern is covered with an insulating film; a via hole penetrating the first tape base material is defined on a connecting regional section used for a via, which is one of connection regions required for electrical connections and is not covered with the insulating film to constitute a one-metal TAB tape; the one-metal TAB tape is bonded to a tape for second metal prepared by providing a metallic film layer on either surface of a second tape base material made from an insulating film through an adhesive layer on which an opening corresponding to the via hole has been defined in such that the metallic foil layer of the tape for second metal is positioned on the opposite surface of the first tape base material; an exposed portion for wire bonding, which has not been covered with the one-metal TAB tape, is allowed to remain on the metallic foil layer in case of the bonding operation; and a stiffener made from a metallic sheet being bonded onto a side of the tape for second metal of a two-metal and two-base material TAB tape prepared by the above-described bonding operation through an adhesive.

According to such TAB tape with a stiffener as described above, a two-metal and two-base material TAB tape having a structure wherein a one-metal TAB tape, which is easily manufactured, is bonded to a tape used for a second metal prepared by providing a metallic foil layer on either surface of a second tape base material made from an insulating film through an adhesive layer, on which an opening corresponding to the above-described via hole has been defined, in such that the metallic foil layer of the above-described tape for second metal is positioned on the other surface of the above-described first tape base material has been used. Thus, it can be very inexpensively manufactured as compared with the case where a conventional two-metal TAB tape is employed.

Furthermore, this TAB tape with a stiffener has such structure wherein a connecting regional section used for a via being a part of a circuit pattern is disposed on either surface of a first tape base material, while a part of a metallic foil layer made of, for example, copper foil is disposed on the other surface thereof, and a blind via hole that extends from the connecting regional section for via to reach the metallic foil layer through a via hole in the first tape base material and an opening in an adhesive layer is defined. Hence, when the connecting regional section for via on the upper edge of the hole is electrically connected with a part of the metallic foil layer on the bottom of the hole in the blind via hole, a potential of the metallic foil layer can drop to a ground potential.

As a manner for attaining an electrical connection in the blind via, there are, for example, the following three manners wherein the first one is a method for melting a solder ball to a mount the same in the above-described blind via, the second one is a method for connecting electrically a connecting regional section for via on the upper edge of the via hole with a part of the metallic foil layer on the bottom of the hole in the blind via by means of a bonding wire, and the third one is a method for folding a connecting lead section extending on the above-described via hole as a part of a circuit pattern, and subjecting the connecting lead section thus folded to contact bonding or welding with respect to a part of the metallic foil layer on the bottom of hole.

In this respect, it is preferred that Au/Ni plating has been applied to a part (with which an electrical connection is to be made) or the whole of the above-described metallic foil layer.

(2) A TAB tape with a stiffener according to a second invention of claim 2 as claimed in claim 1 is characterized by that a connecting regional section for via on the upper edge of a blind via hole is electrically connected with a part of the metallic foil layer on the bottom of the hole by means of a conducting means in the blind via hole extending from the connecting regional section for via in the above-described one-metal TAB tape through the via hole of the above-described first tape base material and the opening in the above-descried adhesive layer to reach the metallic foil layer in the above-described tape for second metal.

(3) A TAB tape with a stiffener according to a third invention of claim 3 as claimed in claim 1 or 2 is characterized by that a part of the above-described blind via hole is sealed with a resin so as to cover the conducting means and the connecting regional section for via.

(4) A semiconductor device according to a fourth invention as claimed in claim 4 is characterized by that an insulating film having a metallic foil layer is bonded onto a portion immediately below a one-metal TAB tape, which has a circuit pattern on either surface thereof and a via hole has been bored on a part thereof by means of punching processing or the like processing through an adhesive layer on a part of which an opening corresponding to the above-described via hole has been defined likewise; a stiffener is bonded to the one-metal TAB tape thus prepared through an adhesive; a semiconductor device is mounted on the stiffener; a solder ball is molten to mount in a blind via hole composed of the above-described via hole and the above-described opening, whereby a specific potential is given to the above-described metallic foil layer situated immediately below the one-metal TAB tape; further, a partial region in the metallic foil layer on a side near to the semiconductor device is exposed from a boundary of the one-metal TAB tape; and the part thus exposed is connected with an electrode of the semiconductor device by means of a bonding wire.

According to such semiconductor device as described above since a TAB tape with a stiffener prepared from a two-metal and two-base material TAB tape having a structure wherein a one-metal TAB tape, which is easily manufactured, is bonded to a tape used for a second metal through an adhesive layer has been used, it can be vary inexpensively manufactured as compared with the case where a conventional two-metal and one-base material TAB tape is employed.

Furthermore, the present invention provides such a constitution wherein a specific electrical potential is applied to a metallic foil layer situated beneath a one-metal TAB tape by melting a solder ball to mount the same in a blind via hole composed of a via hole and an opening. Accordingly, generation of noise due to electromagnetic field coupling between leads in a circuit pattern on either surface of the one-metal TAB tape can be suppressed, so that reliability and speeding up of a velocity of propagation in electric signal can be achieved.

Besides, the present invention provides such a constitution wherein a sectional region (a metallic foil layer section) on the side near to a semiconductor device in the metallic foil layer is exposed outside a region of a one-metal TAB tape, the section thus exposed is connected with an electrode of the semiconductor device by means of wire bonding. As a result, a ground line of the semiconductor device can lead to a ground potential through the above-described metallic foil layer and a blind via hole. Accordingly, speeding up of a transmission rate and stabilization of operation characteristics can be achieved in this point of view.

In this respect, it is preferred that Au/Ni plating has been applied to a part (with which an electrical connection is to be made) or the whole of the above-described metallic foil layer.

(5) A semiconductor device according to a fifth invention as claimed in claim 4 is characterized by that a connecting regional section for via capable of wire bonding is formed around the upper edge of the above-described via hole; the connecting regional section is connected with a part of the metallic foil layer (copper foil) on the bottom in the hole by means of a bonding wire; and the section thus connected is further covered with a resin in stead of melting a solder ball to mount in the above-described blind via hole.

According to the characteristic feature described above, since an electrical connection between the connecting regional section for via and a part of the metallic foil layer on the bottom of the hole in the blind via hole may be carried out as a part of a wire bonding step for connecting a device electrode with a circuit pattern through such wire bonding. Further, the connected section is covered with a resin, so that sufficient protection can be achieved.

(6) A semiconductor device according to a sixth invention as claimed in claim 4 is a characterized by that a connecting lead section is allowed to extend on the above-described via hole as a part of the above-described circuit pattern; the connecting lead section is folded; and the connecting lead section thus folded is fixed to a part of the metallic foil layer on the bottom of the above-described hole by means of contact bonding or welding in stead of melting a solder ball to mount in the above-described blind via hole.

According to the characteristic feature as described above, there is provided a constitution wherein an electrical connection between the connecting regional section and a part of the metallic foil layer on the bottom of the hole is made in such that a connecting lead section, which extends as a part of a circuit pattern 21, is provided on a via hole in the form of, for example, a flying lead, the connecting lead section thus obtained is folded into an S-shape by means of a bonding tool, and it is fixed to a portion of a metallic foil layer on the bottom of the hole by means of contact bonding or welding. As a result, there is no need to implement two-points bonding, but it is sufficient to provide only one bonding portion on a side of the metallic foil layer.

BRIEF DESCRIPTION OF THE DRAWINGS

The present invention will be explained in more detail in conjunction with appended drawings, wherein:

FIG. 2 is a view showing a step for bonding a one-metal TAB tape to a tape used for a second metal contained in a two-metal and two-base material TAB being a component of a TAB tape with a stiffener according to the present invention;

DESCRIPTION OF THE PREFERRED EMBODIMENTS

Embodiments of the invention will be described in detail hereinafter by referring to the accompanying drawings.

Figure 1:
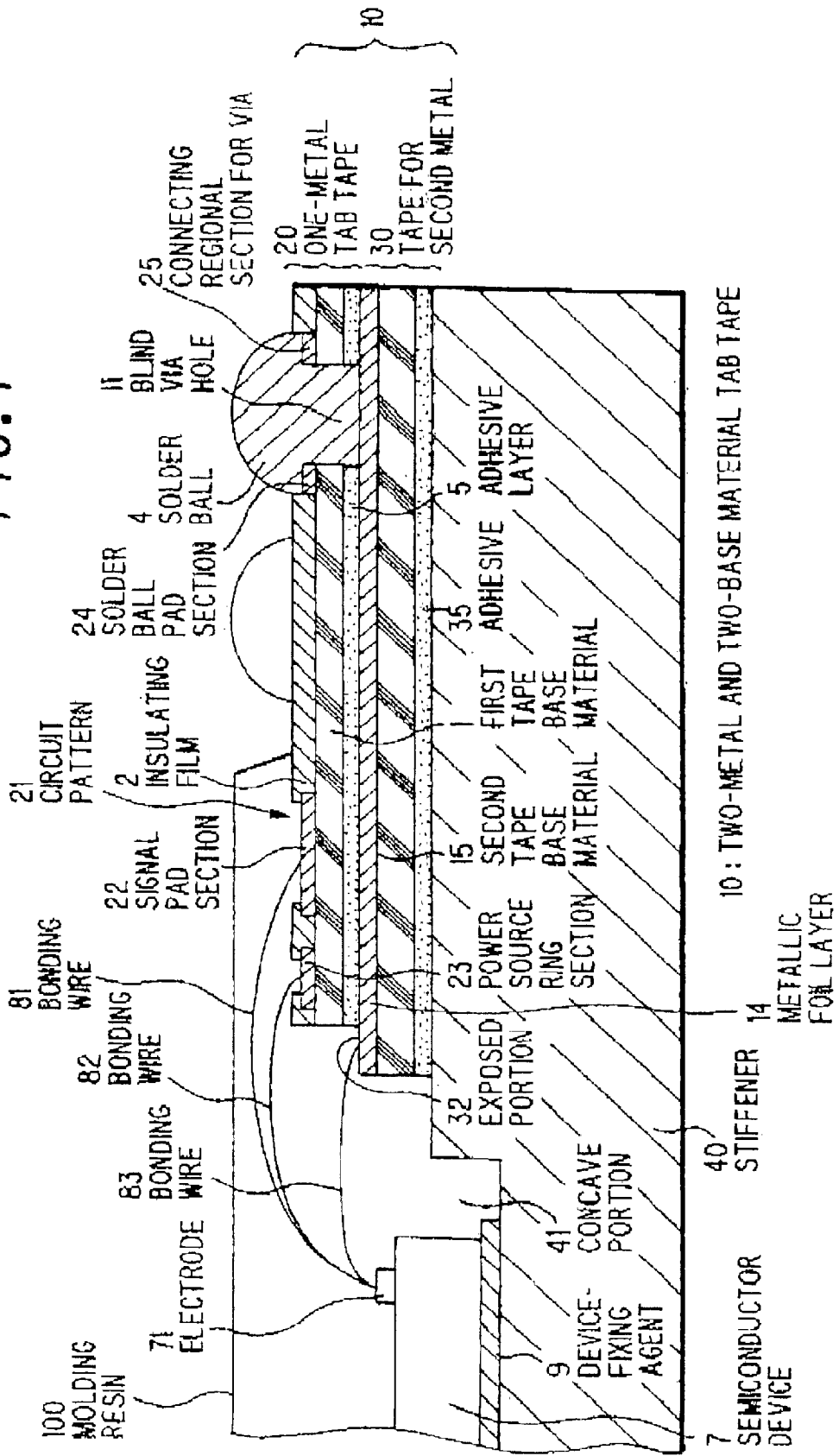
FIG. 1 is a sectional view showing a right half structure of a semiconductor device according to a first embodiment of the present invention.

A typical embodiment is shown in FIG. 1 wherein reference numeral 10 designates a two-metal and two-base material TAB tape, which has been prepared by bonding a one-metal TAB tape 20 to a tape 30 used for a second metal through an adhesive layer 5 as shown in FIG. 2.

In FIG. 2, the one-metal TAB tape 20 has a structure that is obtained by covering a part of a circuit pattern 21 with an insulating film 2 of a photo solder resist (PSR). The circuit pattern 21 provided with a signal circuit containing a signal pad section 22, a power source ring section 23, solder ball pad sections 24, and a routed lead section is formed on either surface of a first tape base material 1 made from a polyimide resin insulating film. Specifically, although the routed lead section is covered with the insulating film 2 in the circuit pattern 21, connection regions requiring electrical connections, respectively, i.e., they are the ones such as the signal pad section 22, the power source ring section 23, and the solder ball pad sections 24 remained as an exposed state that is covered with no insulating film 2.

A via hole 12 passing through the above-described first tape base material 1 is defined on a connecting regional section 25 used for a via (one of the solder ball pad sections 24 in this case) being one of connection regions requiring electrical connections, which have been covered with no insulating film 2.

The adhesive layer 5 contains an opening 13 corresponding to the above-described via hole 12, and the adhesive layer 5 is applied on the other surface of the first tape base material 1 of the aforesaid one-metal TAB tape 20 by means of a coating or pasting step.

In case of the present embodiment, the circuit pattern 21 provided with the signal circuit containing the signal pad section 22, the power source ring section 23, the solder ball pad sections 24, and the routed lead section is formed on either surface of the first tap base material 1 made form an insulating film, and the circuit pattern 21 is insulated by the insulating film 2 with remaining the connection regions 22 to 24 in an exposed state, all of which require electrical connections, respectively. The adhesive layer 5 is bonded to the other surface of the first tape base material 1, and then, the via hole 12 and the opening 13, which pass through the solder ball pad sections 24, the first tape base material 1, and the adhesive layer 5, are defined by punch processing in one stroke with respect to at least one of the solder ball sections 24. According to the present invention, since the aforesaid via hole 12 and the aforesaid opening 13 may be defined in one stroke, it is very effective in view of reducing the number of steps.

The tape 30 used for second metal contains a metallic foil layer 14 made of a copper foil layer functioning as a ground layer (electrically conductive layer) on either surface of a second tape base material 15 made of a polyimide resin insulating film. While an Au/Ni plating has been applied on the whole surface of the metallic foil layer 14, such plating may be applied only a part, i.e., a part to which an electrical connection is to be made, of the metallic foil layer 14. A size of a hole 31 for device to be defined on the tape 30 for second metal is smaller than that of a hole 28 for device to be defined on the one-metal TAB tape 20. For this reason, the metallic foil layer 14 in the tape 30 for second metal is longer than the one-metal TAB tape 20 by a length represented by a distance L in a partial region on a side near to the semiconductor device 7 (a part of the metallic foil layer).

The aforesaid one-metal TAB tape 20 and the aforesaid tape 30 for second metal are bonded through the adhesive layer 5 as shown in FIG. 1 in such that the metallic foil layer 14 is positioned on another side of the first tape base material 1, in other words, a side on which the circuit pattern 21 does not reside. In this case, an exposed portion 32 for wire bonding that is not covered with any one-metal TAB tape 20 remains on the metallic foil layer 14 in the tape 30 for second material because of a relationship according to size in the aforesaid holes 28 and 31 used for devices, respectively.

In the two-metal and two-base material TAB tape 10 prepared by the above-described bonding processing, a stiffener 40 made of a metallic sheet is bonded to a side of the tape 30 for second metal through an adhesive 35 as shown in FIG. 1, whereby a TAB tape with the stiffener is finished.

In the resulting TAB tape with the stiffener, since the two-metal and two-base material TAB tape 10 having a structure obtained by bonding the one-metal TAB tape 20, which is easily manufactured, to the tape 30 for second metal through the adhesive layer 5 is employed, it can be manufactured at a very inexpensive cost as compared with a case where a conventional two-metal and one-base material TAB tape that is prepared by processing a tape provided with metallic foils on both surfaces of one tape base material is employed.

The present TAB tape with stiffeners has been described to have such constitution that there is a blind via hole 11 extending from the connecting regional section 25 used for the one-metal TAB tape 20 to the metallic foil layer 14 in the tape 30 for second metal through the via hole 12 in the first tape base material 1 and the opening 13 in the adhesives layer 5 as described above, and an electrical connection has not yet been made in the blind via hole 11. However, a TAB tape with stiffener according to the present invention is not limited to such a manner of practice as described above, but it may be arranged in such that in the blind via hole 11 extending from the connecting regional section 25 used for the one-metal TAB tape 20 to the metallic foil layer 14 in the tape 30 for second metal through the via hole 12 in the first tape base material 1 and the opening 13 in the adhesive layer 5, the connecting regional section 25 on the upper edge of the hole is electrically connected with a part of the metallic foil layer 14 on the bottom of the hole by means of a conductive means to finish the product. Furthermore, it may be arranged also in such that a part of the blind via hole 11 is covered with a conductive means and the connecting regional sections 25 used for via, and the part so covered is sealed with a resin to finish the product.

FIG. 1 illustrates a structure wherein a solder ball 4 is molten to mount in a blind via hole 11 composed of a via hole 12 and an opening 13, whereby it becomes possible to afford a specific potential to a metallic foil layer 14 beneath a one-metal TAB tape 20, so that an electrical connection is made in the blind via hole 11.

Figure 3:
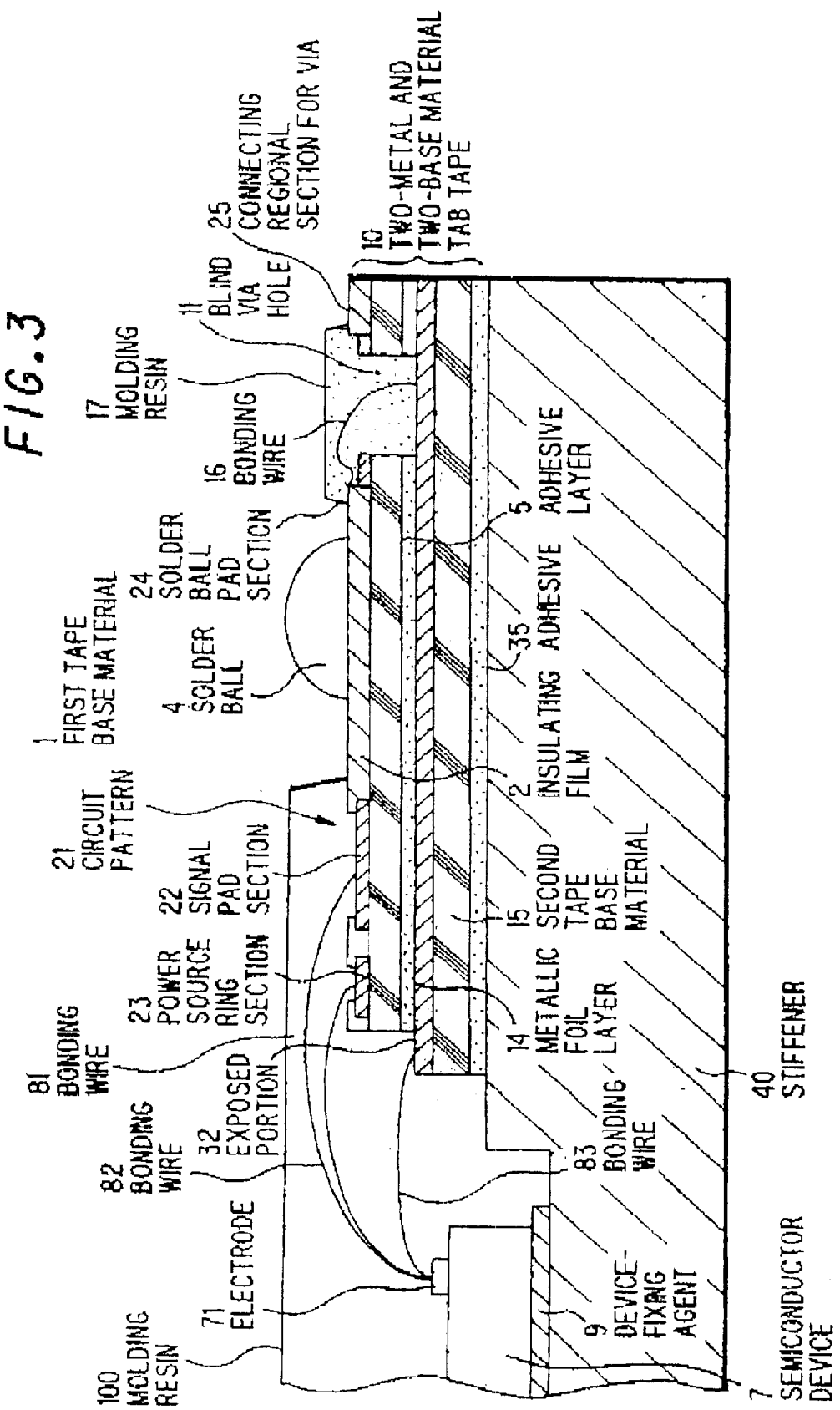
FIG. 3 is a sectional view showing a right half structure of a semiconductor device according to a second embodiment of the present invention.

FIG. 3 illustrates a structure wherein a connecting regional section 25 on the upper edge of a blind via hole 11 is electrically connected with a part of a metallic foil layer 14 on the bottom of the hole in the form of bonding by means of a bonding wire 16, and the resulting section connected is sealed with a molding resin 17.

Figure 4:
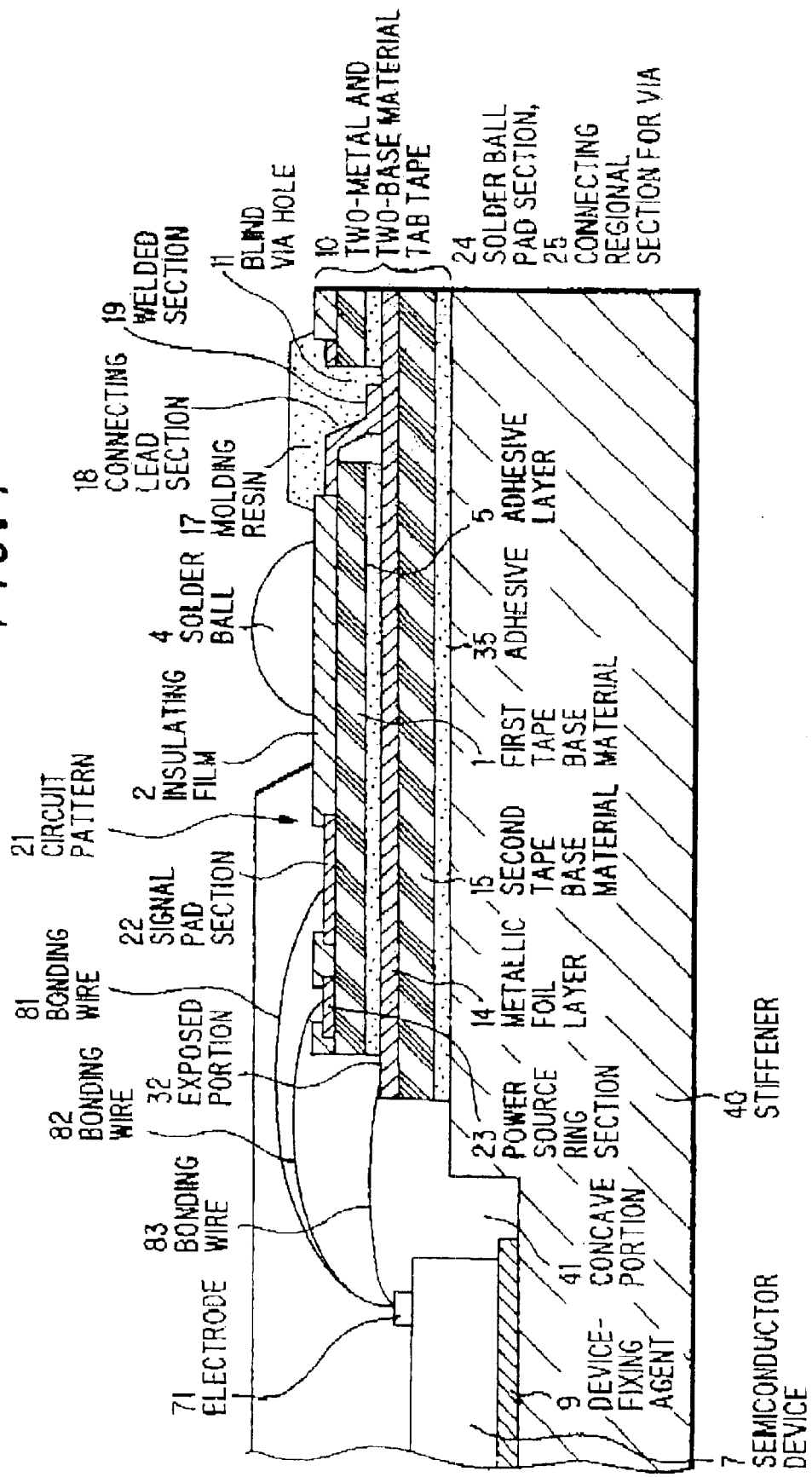
FIG. 4 is a sectional view showing a right half structure of a semiconductor device according to a third embodiment of the present invention.
Figure 5:
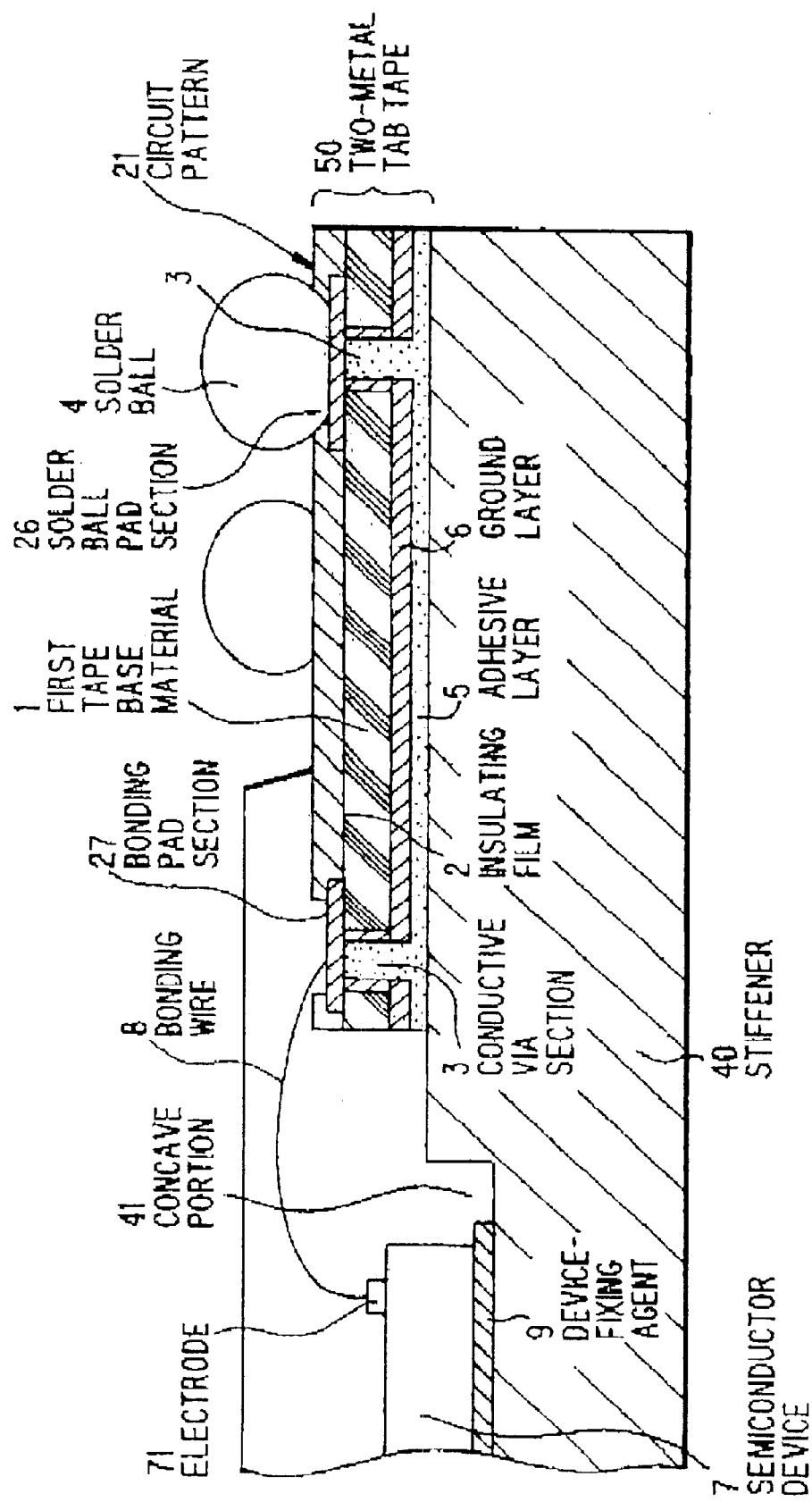
FIG. 5 is a sectional view showing a right half structure of a conventional semiconductor device.

Furthermore, FIG. 4 illustrates a structure wherein a connecting lead section 18, which extends in the form of flying lead as a part of a circuit pattern 21, is provided on a hole in the above-described blind via hall 11, the connecting lead section 18 is folded into an S-shape by means of a bonding tool, and the connecting lead section 18 thus folded is fixed to a portion of a metallic foil layer 14 in the bottom of the hole by means of contact bonding or welding. In FIG. 4, reference numeral 19 designates a welded section of the connecting lead section 18.

In the following, a constitution of a semiconductor device wherein the above-described two-metal TAB tape 10 is used will be described.

A semiconductor devices shown in FIG. 1 is assembled in accordance with the following manner.

First, the above-described two-metal TAB tape 10 is utilized wherein a semiconductor device 7 is mounted in a concave portion 41 of a stiffener 40 through a device fixing agent 9. A signal pad section 22 of a circuit pattern 21 is a connected with a signal electrode among electrodes 71 of the semiconductor device 7, which corresponds to the above-described signal pad section 22, by means of a bonding wire 82, while a power source ring section 23 of the circuit pattern 21 is connected with a power source electrode among the electrodes 71 of the semiconductor device 7, which corresponds to the above-described power source ring section 23, by means of a bonding wire 83.

Moreover, a solder ball 4 is molten to mount in a blind via hole 11 composed of the above-described via hole 12 and an opening 13, whereby an electrical connection is made between a connecting regional section 25 used for a via in the upper edge of the hole and a part of a metallic foil layer 14 in the bottom of the hole, so that a specific ground potential is afforded to the metallic foil layer 14 situated beneath a one-metal TAB tape 20. As a result, it becomes possible to suppress generation of noise due to electromagnetic field coupling between leads in a circuit pattern 21 on either surface of a one-metal TAB tape and to achieve speeding up of a velocity of propagation.

Furthermore, a partial region (a part of a metallic foil layer) on a side near to the semiconductor device 7 in the metallic foil layer 14 is allowed to expose outside the one-metal TAB tape 20, the part thus exposed 32 is connected with a ground electrode among the electrodes 71 of the semiconductor device 7 by means of a bonding wire 81, so that a ground line for the semiconductor device 7 leads to a ground potential through the metallic foil layer 14 and the blind via hall 11. As a result, stabilization for operating characteristics of the semiconductor device 7 having a fast transmission rate can be attained.

In order to protect electrical connections in a peripheral region of the semiconductor chip 7, a molding resin 100 seals the semiconductor chip 7, the bonding wires 81, 82, and 83, the circuit pattern 21 and the like so as to envelop them. In this respect, the arrangement is the same as that of semiconductor devices shown in FIGS. 3 and 4, which will be mentioned hereinafter.

The semiconductor device shown in FIG. 3 has a structure wherein a connecting regional section 25 used for a via being capable of wire bonding is formed around the upper edge of a via hole 12 in stead of melting a solder ball 4 to mount the same in a blind via hole 11 as described above. The connecting regional section 25 for via is connected with a part of a metallic foil layer 14 in the bottom of the hole, and the section thus connected is covered with a molding resin 17 to protect the same. According to the present embodiment, since an electrical connection in the blind via hole 11 is made by means of a bonding wire 16, such connection by means of wire bonding may be carried out as a part of a wire bonding step for connecting a device electrode 71 with a circuit pattern 21.

A semiconductor device shown in FIG. 4 has a structure wherein a connecting lead section 18, which extends in the form of flying lead as a part of a circuit pattern 21, is provided on a via hole 12, the connecting lead section 18 is folded into an S-shape by means of a bonding tool, and the connecting lead section 18 thus folded is fixed to a portion of a metallic foil layer 14 in the bottom of the hole by means of contact bonding or welding in place of melting a solder ball 4 to mount the same in a blind via hole 11 as described above. As a result, according to the present embodiment, there is used no bonding wire, besides, it is sufficient to provide only one bonding portion on a side of the metallic foil layer.

As mentioned above, the following excellent advantages are obtained in accordance with the present invention.

(1) According to a TAB tape with a stiffener as described in claims 1 to 3, a two-metal and two-base material TAB tape having a structure wherein a one-metal TAB tape, which is easily manufactured, is bonded to a tape used for a second metal prepared by providing a metallic foil layer on either surface of a second tape base material made from an insulating film through an adhesive layer has been used, so that it can be very inexpensively manufactured as compared with the case where a conventional two-metal TAB tape is employed.

Furthermore, the TAB tape with a stiffener has such structure wherein a connecting regional section used for a via being a part of a circuit pattern is disposed on either surface of a first tape base material, while a part of a metallic foil layer is disposed on the other surface thereof, and a blind via hole that extends from the connecting regional section for via to reach the metallic foil layer through a via hole in the first tape base material and an opening in an adhesive layer is defined. Hence, when the connecting regional section for via in the upper edge of the via hole is electrically connected with a part of the metallic foil layer in the bottom of the hole in the blind vial hole, a potential of the metallic foil layer can drop to a ground potential.

(2) According to a semiconductor device as described in claims 4 to 6, a TAB tape with a stiffener prepared from a two-metal and two-base material TAB tape having a structure wherein a one-metal TAB tape, which is easily manufactured, is bonded to a tape used for a second metal through an adhesive layer has been used, so that it can be very inexpensively manufactured as compared with the case where a conventional two-metal TAB tape is employed.

Furthermore, the present invention provides such a constitution wherein a specific electrical potential is applied to a metallic foil layer situated beneath a one-metal TAB tape through an electrical connection by melting a solder ball to mount the same in a blind via hole composed of a via hole and an opening, or wire-bonding a connecting regional section around the upper edge of the via hole with a part of a metallic foil layer on the bottom of the hole, or welding a connecting lead section. Accordingly, generation of noise due to electromagnetic field coupling between leads in a circuit pattern can be suppressed, and equivalent reliability as well as equivalent speeding up of a transmission rate in electric signal to those of the case where a conventional two-metal and one base-material TAB tape is used can be achieved.

Besides, the present invention provides such a constitution wherein a sectional region on the side near to a semiconductor device in a metallic foil layer is exposed outside a region of a one-metal TAB tape, the section thus exposed is connected with an electrode of the semiconductor device by means of wire bonding. As a result, a ground line of the semiconductor device can lead to a ground potential through the above-described metallic foil layer and a blind via hole. Accordingly, speeding up of a transmission rate and stabilization of operation characteristics can be achieved in this point of view.

It will be appreciated by those of ordinary skill in the art that the present invention can be embodied in other specific forms without departing from the spirit or essential characteristics thereof.

The presently disclosed embodiment is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A TAB tape with a stiffener, comprising:
    a one-metal TAB tape having a circuit pattern containing a signal circuit being formed on either surface of a first tape base material made of an insulating film, a part of said circuit pattern being covered with an insulating film, and a via hole penetrating said first tape base material being defined on a connecting regional section used for a via, which is one of connection regions required for electrical connections and is not covered with the insulating film;
    a tape for a second metal having a metallic foil layer functioning as a ground layer on either surface of a second tape base material made of an insulating film, being bonded in a bonding operation to said one-metal TAB tape through an adhesive layer having an opening corresponding to said via hole, the metallic foil layer being positioned on the opposite surface of said first tape base material;
    an exposed portion for wire bonding, which has not been covered with said one-metal TAB tape, which remains on said metallic foil layer in case of said bonding operation; and
    a stiffener made of a metallic sheet, being bonded onto a side of the tape for second metal of a two-metal and two-base material TAB tape prepared by said bonding operation through and adhesive.

2. A TAB tape with a stiffener as claimed in claim 1, wherein:
    a connecting regional section for via on the upper edge of a blind via hole is electrically connected with a part of the metallic foil layer on the bottom of the hole by means of a conducting means in said blind via hole extending from the connecting regional section for via in said one-metal TAB tape through the via hole of said first tape base material and the opening in said adhesive layer to reach the metallic foil layer in said tape for second metal.

3. A TAB tape with a stiffener as claimed in claim 2, wherein:
    a part of said blind via hole sealed with a resin so as to cover the conducting means and the connecting regional section for via.

4. A semiconductor device, comprising:
    a one-metal TAB tape having a circuit pattern on either surface of a first tape base material made of an insulating film and a via hole bored on a part thereof;
    a tape for second metal having an insulating film with a metallic foil layer functioning as a ground layer being bonded onto a portion immediately below the one-metal TAB tape on a first surface of said one-metal TAB tape through an adhesive layer having an opening corresponding to said via hole, the metallic foil layer being positioned on a surface of said first tape base material,
    a stiffener being bonded to said tape for second metal through an adhesive in a second surface of said one-metal TAB tape;
    a semiconductor device being mounted on the stiffener;
    a solder ball being molten to mount in a blind via hole, composed of said via hole and said opening, wherein a specific potential is given to said metallic foil layer situated immediately below the one-metal TAB tape through the adhesive layer;
    a partial region in the metallic foil layer on a side near to the semiconductor device being exposed from a boundary of the one-metal TAB tape; and
    the partial region being connected with an electrode of the semiconductor device by means of a bonding wire.

5. A semiconductor device as claimed in claim 4, further comprising:
    a connecting regional section for via, capable of wire bonding, that is formed around the upper edge of said via hole;
    wherein the connection regional section is connected with a part of the metallic foil layer on the bottom in the hole by means of a bonding wire;
    the connecting regional section being covered with a resin;

instead of melting a solder ball to mount in said blind via hole.

6. A semiconductor device as claimed in claim 4, further comprising:

a connecting lead section that extends on said via hole as a part of said circuit pattern;

wherein the connecting lead section is folded; and the connecting lead section is fixed to a part of the metallic foil layer on the bottom of said hole by means of contact bonding or welding; instead of melting a solder ball to mount in said blind via hole.

7. A semiconductor device as claimed in claim 1, wherein the insulating film is disposed directly against and below the exposed portion for wire bonding.

8. A semiconductor device as claimed in claim 4, wherein the insulating film is disposed directly against and below the partial region in the metallic foil layer.

* * * * *